(12) United States Patent
Du et al.

(10) Patent No.: US 10,899,014 B2
(45) Date of Patent: Jan. 26, 2021

(54) MULTIPLE LENS-BASED SMART MECHANICAL ARM AND POSITIONING AND ASSEMBLY METHOD THEREOF

(71) Applicant: South China University of Technology

(72) Inventors: Juan Du, Guangzhou (CN); Jiansheng Tan, Guangzhou (CN); Ying Feng, Guangzhou (CN)

(73) Assignee: SOUTH CHINA UNIVERSITY OF TECHNOLOGY

( * ) Notice: Subject to any disclaimer, the term of this patent is extended or adjusted under 35 U.S.C. 154(b) by 300 days.

(21) Appl. No.: 15/781,856

(22) PCT Filed: Dec. 7, 2016

(86) PCT No.: PCT/CN2016/108868
§ 371 (c)(1),
(2) Date: Jun. 6, 2018

(87) PCT Pub. No.: WO2017/128865
PCT Pub. Date: Aug. 3, 2017

(65) Prior Publication Data
US 2018/0361588 A1 Dec. 20, 2018

(30) Foreign Application Priority Data

Jan. 27, 2016 (CN) .......................... 2016 1 0057202

(51) Int. Cl.
*G06K 9/00* (2006.01)
*B25J 9/16* (2006.01)
(Continued)

(52) U.S. Cl.
CPC ........... *B25J 9/1697* (2013.01); *B25J 11/005* (2013.01); *B25J 13/084* (2013.01); *B25J 19/023* (2013.01);
(Continued)

(58) Field of Classification Search
CPC ........ B25J 11/005; B25J 13/084; B25J 19/02; B25J 19/023; B25J 9/06; B25J 9/1697;
(Continued)

(56) References Cited

U.S. PATENT DOCUMENTS 10,059,001 B2 * 8/2018 Miyazawa ............. B25J 9/1697

FOREIGN PATENT DOCUMENTS

| CN | 1067505 A | 12/1992 |
| CN | 101924953 | 12/2010 |

(Continued)

*Primary Examiner* — Duy M Dang
(74) *Attorney, Agent, or Firm* — The Dobrusin Law Firm, P.C.

(57) ABSTRACT

A multiple lens-based smart mechanical arm, wherein it comprises a multi joint multi-functional mechanical arm, a CCD camera for collecting PCB board images to be assembled, a bio-contact device, and a computer; the CCD camera is mounted on the multi joint multi-functional mechanical arm, the bio-contact device is mounted on the fingertip of the multi joint multi-functional mechanical arm, and the CCD camera, and the bio-contact device and the multi joint multi-functional mechanical arm are connected to the computer. The invention adds a biological tactile device on the basis of the binocular positioning to accurately locate the assembly target area and improve the accuracy of the assembly of the irregular parts. The conversion relationship between the pressure and electric output of the sensitive material in the bio-contact device and the mathematical model of pressure and position is applied. The present invention realizes high-precision and real-time assembly of irregular parts and improves the production efficiency of the electronic assembly industry.

10 Claims, 3 Drawing Sheets

(51) Int. Cl.
*H05K 13/04* (2006.01)
*H05K 13/08* (2006.01)
*B25J 13/08* (2006.01)
*H04N 13/239* (2018.01)
*H04N 13/00* (2018.01)
*G06T 7/73* (2017.01)
*H04N 13/246* (2018.01)
*G06T 7/80* (2017.01)
*B25J 11/00* (2006.01)
*B25J 19/02* (2006.01)
*H04N 5/225* (2006.01)
*H04N 5/247* (2006.01)
*G06T 7/12* (2017.01)
*G06T 7/194* (2017.01)
*G06T 5/00* (2006.01)

(52) U.S. Cl.
CPC ............... *G06T 7/74* (2017.01); *G06T 7/85* (2017.01); *H04N 5/2253* (2013.01); *H04N 5/247* (2013.01); *H04N 13/00* (2013.01); *H04N 13/239* (2018.05); *H04N 13/246* (2018.05); *H05K 13/0404* (2013.01); *H05K 13/082* (2018.08); *H05K 13/0812* (2018.08); *H05K 13/0815* (2018.08); *G06T 5/009* (2013.01); *G06T 7/12* (2017.01); *G06T 7/194* (2017.01); *G06T 2207/10012* (2013.01); *G06T 2207/30141* (2013.01); *H05K 13/0408* (2013.01)

(58) Field of Classification Search
CPC ....... G06T 7/74; G06T 7/85; G06T 2207/009; G06T 7/12; G06T 7/194; G06T 5/009; G06T 2207/30141; H04N 13/00; H04N 13/239; H04N 13/246; H04N 5/2253; H04N 5/247; H05K 13/0404; H05K 13/0812; H05K 13/0815; H05K 13/082; H05K 3/30; H05K 13/0408; H05K 2203/0195

See application file for complete search history.

(56) References Cited

FOREIGN PATENT DOCUMENTS

| | | |
|---|---|---|
| CN | 203266633 U | 11/2013 |
| CN | 104296657 A | 1/2015 |
| CN | 104476549 A | 4/2015 |
| CN | 104933718 A | 9/2015 |
| CN | 105538345 A | 5/2016 |
| CN | 205466320 U | 8/2016 |
| JP | 2010276447 A | 12/2010 |
| JP | 2011011315 A | 1/2011 |
| JP | 5451219 B2 | 1/2014 |

\* cited by examiner

MULTIPLE LENS-BASED SMART MECHANICAL ARM AND POSITIONING AND ASSEMBLY METHOD THEREOF

The present invention relates to the technical field of the electronic assembly, in particular to a multiple lens-based smart mechanical arm and a positioning and assembly method thereof.

BACKGROUND OF THE INVENTION

At present, in the mechanical and electronic assembly industry, the installation of irregular components on the PCB usually depends on manual assembly by workers on the assembly line. Manual assembly mainly depends on operators' eyes and experience. After a long time of work, it cannot guarantee production efficiency. Moreover, manual assembly has some subjectivity and cannot maintain the same quality level of each product. Therefore, it is necessary to introduce the automation technology into electronic assembly industry. Automation technology replaces of the human assembly can effectively increase production efficiency, save manpower resources, and ensure assembly quality.

Related companies have used mechanical arms instead of operators to work on the assembly line. But the assembly accuracy of mechanical arms is not as good as manual assembly and the production efficiency cannot be improved obviously, because the mechanical arms cannot locate the components without eyes while workers can rely on the tactile experience of their hands to prompt assembly.

SUMMARY OF THE INVENTION

In order to solve the above-mentioned problems in the prior art, the present invention is to provide a multiple lens-based smart mechanical arm and a positioning and assembly method.

The present invention is implemented by the following technical solutions: A multiple lens-based smart mechanical arm comprises a multi joint multi-functional mechanical arm, a CCD camera for collecting PCB board images to be assembled, a bio-contact device, and a computer; the CCD camera is mounted on the multi joint multi-functional mechanical arm, the bio-contact device is mounted on the fingertip of the multi-joint multi-functional mechanical arm, and the CCD camera, and the bio-contact device and the multi-joint multi-functional mechanical arm are connected to the computer.

There are two CCD cameras which are installed on the left and right sides of the forearm of the multi-joint multi-functional mechanical arm respectively The bio-contact device comprises a chip made of a sensitive material and a signal measurement circuit for measuring deformation of the chip and outputting an electrical signal; the chip is covered on the fingertip of the mechanical arm and connected with the signal measurement circuit; the signal measurement circuit is connected with a computer and provided inside the multi-joint multi-function mechanical arm.

The shape of the chip is finger-sleeve type.

The sensitive material is made of conductive rubber.

The two CCD cameras have the same model and parameters; the binocular camera coordinate system is coplanar and the coordinate axes are placed in parallel.

A positioning and assembly method of the smart mechanical arm which comprises the following steps:

S1. the PCB to be assembled is transported to the front of the mechanical arm, two images of the PCB board to be assembled captured by two CCD camera are opened, which are the left and right image respectively;

S2. the two PCB board images obtained by the computer are matched with the PCB template pre-inputted in the computer, and the target area of irregular parts to be assembled in the two images is determined;

S3. a binocular positioning algorithm is adopted to measure the distance between the target area to be assembled and the mechanical arm fingertip, and the computer controls the mechanical arm to move to the target area and completes the preliminary positioning;

S4. the bio-contact device of the mechanical arm fingertip is used to make contact with the target area after the preliminary positioning in S3, the deformation electrical signal generated by the chip is output to the computer through the signal measuring circuit, and the computer adjusts the position to realize accurate positioning and complete the assembly.

In the step 2, the image captured by two CCD cameras of the PCB board to be assembled is filtered and denoised, an edge detection operator can be used to pick the edge portion of the PCB board out and remove the background, a piecewise linear transform enhancement method is used to enhance the image and improve the contrast of the image, a template matching method based on the grayscale is used to determine the target area to be assembled.

In the step 3, the binocular positioning algorithm is used to measure the distance between the target area and the fingertip of the mechanical arm; the computer controls the mechanical arm to move to the target area to be assembled and completes the preliminary positioning, that is:

S3.1 the Zhang Zhengyou calibration algorithm is used to solve the camera's internal parameter matrix and external parameter matrix; then a binocular stereoscopic calibration is performed to determine and the relative position between the left and right cameras, the relative position of the left and right cameras including rotation matrix R and translation vector T;

S3.2 the pixel-to-pixel matching of two images is performed by using the gray-scale cross-correlation matching method based on template matching;

S3.3 the distance between the target to be assembled and the mechanical arm fingertip by the binocular positioning algorithm is binocular ranging system imaging theory;

$$l = \frac{Bf}{x}$$

$$x = x_{left} - x_{right}$$

wherein the distance between the projection centers of the left and right cameras is the base line distance B, the target point A is imaged on the A1 point on the left CCD image plane and the A2 point on the right CCD image plane when passing through the binocular ranging system consisting of left and right cameras with parallel axes, with the positions of $x_{left}$ and $x_{right}$ on the left and right image planes respectively, the camera focal lengths are f, and x is the difference in the position of the imaging point on the left and right CCD image planes by the binocular camera respectively at point A In the step 4, after preliminary positioning, the bio-contact device of the mechanical arm fingertip contacts with the PCB board to be assembled; the pressure on the sensitive material on the bio-contact device changes due to deformation, thereby changing the output electrical signals; the computer adjusts the position of the mechanical arm according to the output signal and mathematical model of pressure and position so as to achieve accurate positioning and assemble the irregular parts.

The present invention has the following advantages:

1. The invention can automatically complete the precise location of the PCB board in assembly area without human intervention, and be competent for the irregular components assemble work.

2. In the present invention, the image of a PCB board can be collected and processed separate by two CCD cameras, which can fulfill the requirements of rapidity and real-time performance of electronic assembly industry.

3. In the present invention, a biological tactile device is provided to accurately locate the assembly target area and improve the accuracy of the assembly of the irregular parts.

4. In this invention, the binocular positioning algorithm of the digital image processing is applied in the location of the mechanical arm to locate the position, which effectively measure the distance between the mechanical arm and the target assembly area.

5. The invention uses the method of template matching to determine the target area of the irregular parts, and improves the accuracy of the subsequent locate work.

DESCRIPTION OF FIG.S

DESCRIPTION OF EXAMPLE EMBODIMENTS OF THE INVENTION

The present invention will be further described in detail below with reference to examples and Figures.

Embodiment 1

Figure 1:
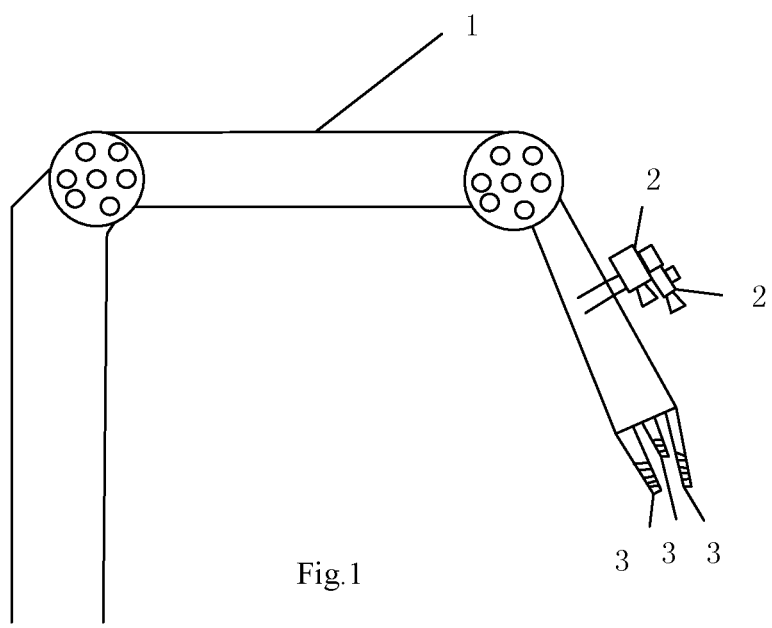
FIG. 1 is a schematic structural view of a smart mechanical arm in the present invention.

As shown in FIG. 1, a multiple lens-based smart mechanical arm comprises a multi-joint multi-functional mechanical arm 1, a CCD camera 2 for collecting images of PCB board to be assembled, a bio-contact device 3, and a computer. There are two CCD cameras which are installed on the left and right sides of the forearm respectively. The camera can be installed on different portions of the mechanical arm according to actual situations. The bio-contact device can convert the position information of the area to be assembled into electrical signals and give feedback to the computer. The number of bio-contact sites can be adjusted according to actual requirements. The computer is responsible for processing the collected image and the electrical signal feedback and sending a control signal to direct the mechanical arm to complete the final positioning and assembly of irregular parts. A control circuit is provided inside the mechanical arm and is connected to a computer.

The two CCD cameras used in the present invention have the same model and parameters and parallel optical axis. The binocular camera coordinate system is coplanar and the coordinate axes are placed in parallel. Left and right images collected by the cameras have the same size and proportion, and the grayscale information of the image remains relatively intact.

Figure 2:
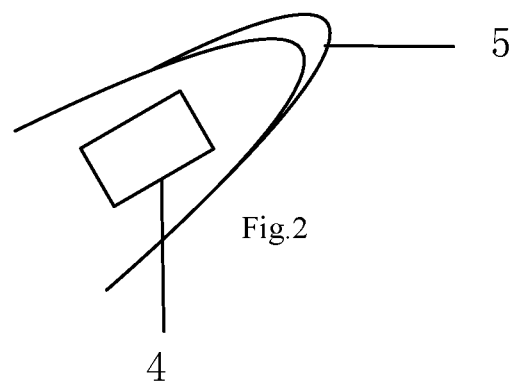
FIG. 2 is a schematic structural view of the bio-contact device in the present invention.

As shown in FIG. 2, the bio-contact device comprises a chip 5 made of a sensitive material and a signal measurement circuit 4 for measuring deformation of the chip and outputting an electrical signal. The chip is covered on the fingertip of the mechanical arm and connected with the signal measurement circuit; the signal measurement circuit 4 is connected with a computer and provided inside the multi joint multi-function mechanical arm. The chip is in present embodiment is finger sleeve chip and three chips are applied on the fingertips of the mechanical arm.

The sensitive material has a pressure-electrical output characteristic that can convert the received pressure into electrical signals. The shape of the chip is finger-sleeve type, and the sensitive material is made of conductive rubber. The bio-contact device made of the sensitive material is generally mounted on the fingertips of the mechanical arm. When the fingertips come into contact with the PCB, the pressure of the sensitive material on the bio-contact device will change due to deformation, resulting in changes in the output electrical signal. Through the signal measuring circuit, the output electrical signal which results from the deformation of the bio-contact device can be measured and transmitted to the computer. The computer can acquire the position information of the current mechanical arm according to the mathematical model obtained in advance, and output the corresponding control signal to adjust the position of mechanical arm.

Figure 3A:
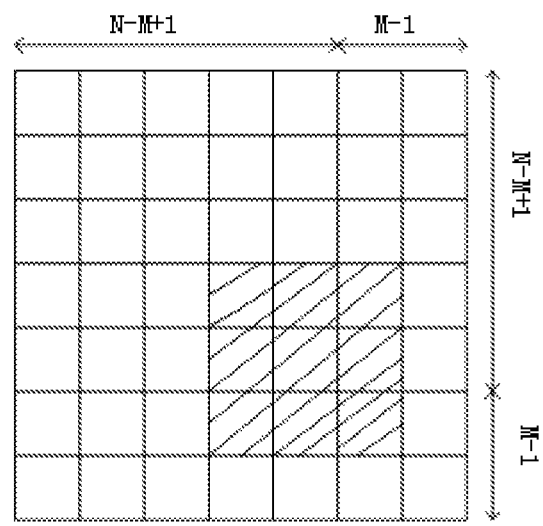
FIG. 3a is a searched map of the template matching method in the present invention; FIG.
Figure 3B:
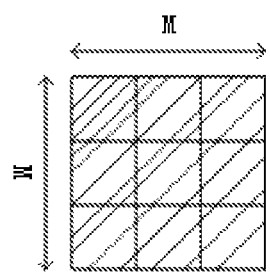
FIG. 3b is a schematic diagram of the matching template in the present invention.

FIG. 3a is a searched image, and FIG. 3b is a matching template. The matching template is provided on the searched image and moves translationally. The searched image under the template is a sub-image. Compare the content of the sub-image and matching template. The largest similarity value between the two images means the content of them is consistent, and the sub-image at this time is the matching area to be found.

Figure 4:
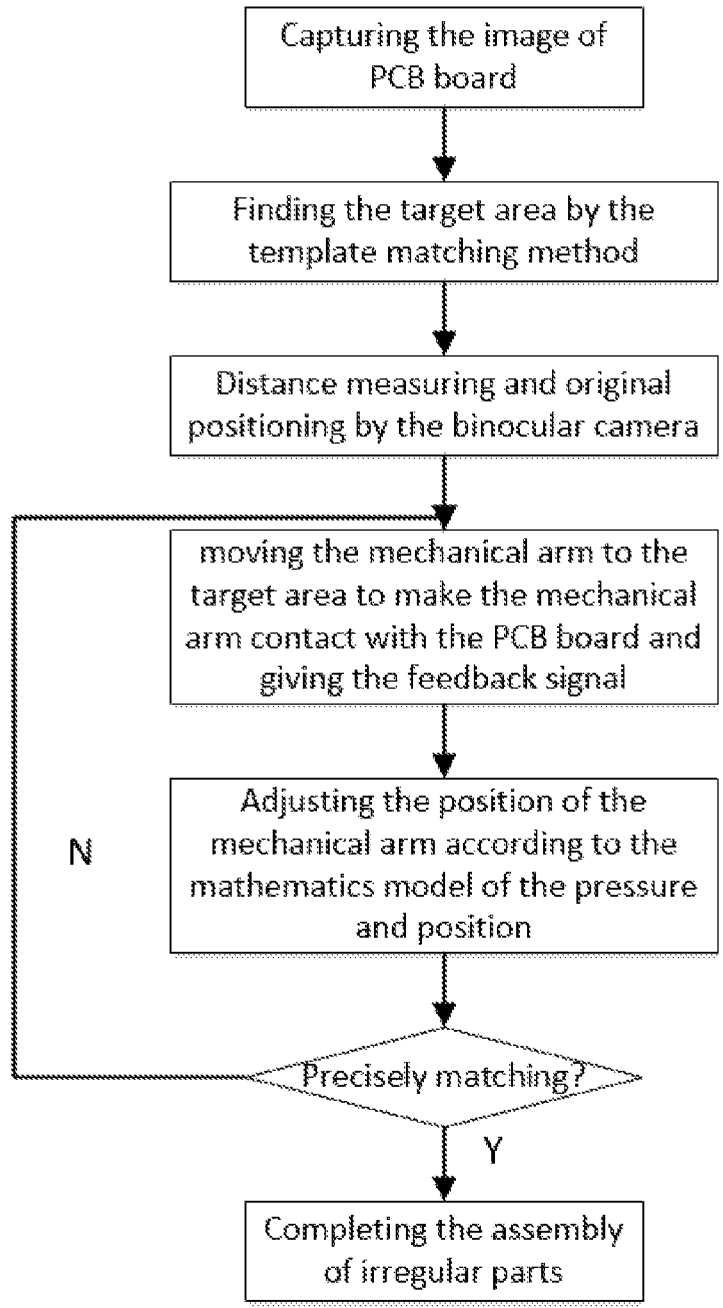
FIG. 4 is a flowchart of the operation in the present invention.

As shown in FIG. 4, the positioning and assembly method implemented by the mechanical arm includes the following steps.

S1 Obtaining an Image of the PCB to be Assembled

The PCB to be assembled is transported by the assembly line to the front of the mechanical arm. Adjust the brightness of the light source and capture PCB board images by 2 CCD cameras which are installed in left and right side. The CCD camera installed on the left side is the left CCD camera, the image captured by which is the left image, and the image taken by the right CCD camera is the right image.

S2 Matching Templates to Find the Target Area to be Assembled

There are many noises in the PCB board image captured from the production line. Therefore, the image must be filtered and denoised firstly. The image captured by the camera includes the PCB to be assembled, which is called the foreground. The image also includes a background. In order to identify and analyze the target area, it is necessary to extract the foreground from the background. Therefore, the image must be image-divided. Since the target (PCB board) has a regular geometric shape, an edge detection operator can be used to extract the edge portion of the PCB board and remove the background.

In order to improve the visibility of the image, the detail information and the edges of the image are highlighted and enhanced, which is beneficial to the subsequent template matching of the target area to be assembled. It is necessary to enhance the PCB board image, improve the contrast of the image, and convert the original grayscale range according to a mapping relationship, thereby enhancing the contrast between the background image and the target image. The present invention uses a piecewise linear transformation enhancement method to achieve this effect. Suppose the grayscale function of the original image is f(r,c), the grayscale range is [0,$M_f$], the transformed image function is expressed as g(r,c), the grayscale range is [0,$M_g$], and the conversion formula can be expressed as below:

$$\begin{cases} \frac{M_g - d}{M_f - b}[f(r, c) - b] + d & b \le f(r, c) \le M_f \\ \frac{d - c}{b - a}[f(r, c) - a] + c & a \le f(r, c) < b \\ \frac{c}{a}f(r, c) & 0 \le f(r, c) \le a \end{cases}$$

Template matching is the process of finding the template image in the image to be searched by calculating similarity between them. The process of template matching can be expressed as that: Firstly, calculate the similarity value between the template image and the searched image by pixel, and then find the area with largest similarity value as the matching position. The principle is shown in FIG. 3a and FIG. 3b.

After image enhancement of the PCB board image, because the distribution of the grayscale values in each area of the PCB board image is uniform and fixed, the present invention adopts a template matching method based on the grayscale. The template matching method based on the grayscale is to use the grayscale of the entire image as a similarity value, and use the defined search strategy to search the image to be searched in the order from top to bottom and from left to right to find the region that meets the conditions. By setting a search window of a specified size, a search comparison is performed in the search window.

The position of the target in the image to be searched can be described by translational movement. The template is represented by image t(r,c), wherein the region of interest is designated as T. Template matching is to move the region of interest T in the template translationally in a certain sequence in the image to be matched, and then calculate the similarity value s between the specific region in the image to be matched and the region of interest in the template. The similarity value is described by:

$$s(r,c) = s\{t(u,v), f(r+u, c+v); (u,v) \in T\}$$

Wherein s(r,c) represents the similarity value calculated based on the grayscale, t(u,v) represents the grayscale of each point in the template, f(r+u, c+v) represents the grayscale of the region of interest in the template moved to the current position of the image.

The simplest way to find the similarity value is to calculate the sum of absolute values (SAD) or the sum of squares of all differences (SSD) of the two images. SAD and SSD can be represented by the following two formulas:

$$sad(r, c) = \frac{1}{n} \sum_{(u,v) \in T} |t(u, v) - f(r + u, c + v)|$$

$$ssd(r, c) = \frac{1}{n} \sum_{(u,v) \in T} [t(u, v) - f(r + u, c + v)]^2$$

Wherein n represents the number of pixels in the template in the area of interest, that is n=|T|. For SAD and SSD, the greater the degree of similarity, the greater the difference between the image to be searched and the template is. So Grayscale-based template matching method can be used to determine the target area to be assembled S3. The binocular positioning algorithm was used to measure the distance between the target area and the fingertip of the mechanical arm. The computer controls the mechanical arm to move to the target area to be assembled and complete the preliminary positioning.

S3.1 Calibrating Binocular Cameras

Since the invention uses a binocular stereo system consisting of two cameras with the same parameters, it is proposed that the two cameras are calibrated separately to solve the internal and external parameters. The conversion relationship between the image coordinate system and the world coordinate system as the following formula:

$$s \begin{bmatrix} u \\ v \\ 1 \end{bmatrix} = \begin{bmatrix} f_x & 0 & u_0 & 0 \\ 0 & f_y & v_0 & 0 \\ 0 & 0 & 1 & 0 \end{bmatrix} \begin{bmatrix} R_{3\times 3} & T_{3\times 1} \\ 0^T & 1 \end{bmatrix} \begin{bmatrix} X_w \\ Y_w \\ Z_w \\ 1 \end{bmatrix}$$

$$= AM \begin{bmatrix} X_w \\ Y_w \\ Z_w \\ 1 \end{bmatrix} = H \begin{bmatrix} X_w \\ Y_w \\ Z_w \\ 1 \end{bmatrix}$$

A is the camera's internal parameter matrix. M is the external parameter matrix of the camera and is determined by the position and direction of the camera relative to the world coordinate system. It is independent of the camera's internal parameter map pinhole camera model. The Zhang Zhenyou calibration algorithm is used to solve the camera's internal parameter matrix and external parameter matrix.

After calibration of a single camera and obtaining the internal and external parameters of a single camera, a double-headed stereo calibration is performed again, and the relative position between the left and right cameras is calculated as an external parameter, that is, the relative position of the left and right cameras including rotation matrix R and translation vector T.

Assume that the three-dimensional world coordinate of point P on the checkerboard calibration plate is $X_w$, and the two cameras simultaneously capture the image. The coordinates of point P in the left and right cameras' coordinate systems are respectively $X_L$ and $X_R$, and the external reference matrix of the left and right cameras are respectively ($R_L, t_L$) and ($R_R, t_R$). According to the conversion relationship between the three-dimensional world coordinate system and the camera coordinate system, there are the following formulas.

$$\begin{cases} X_L = R_L X_W + t_L \\ X_R = R_R X_W + t_R \end{cases}$$

According to the above formulas, the conversion relationship from the left camera to the right camera can be obtained as follows.

$$X_R = RX_L + T$$

Wherein $$R = R_R R_L^{-1}, T = t_R - Rt_L$$

Then, according to the external parameters of the left and right cameras, the relationship parameters of the stereo camera in the binocular vision system can be obtained, that is, the positional relationship of the stereo camera. Until now the calibration of the binocular camera are finished.

S3.2 the Pixel-to-Pixel Matching of Two Images is Performed by the Gray-Scale Cross-Correlation Matching Method Based on Template Matching.

The two CCD cameras used in the present invention have the same model and parameters and basically parallel optical axis. The binocular camera coordinate system is coplanar and the coordinate axes are placed in parallel. Left and right images captured simultaneously have the same size and proportion, and the grayscale information of the image remains relatively intact. And the target area image to be assembled has been determined in S2. The present invention uses the gray-scale cross-correlation matching method based on template matching to complete the high-precision matching of the target image area.

The normalized cross-correlation matching algorithm determines whether there is a match according to the cross-correlation function established between the template image and the searched sub-image of the image to be matched, and the cross-correlation function is listed below.

$$N(i, j) = \frac{\sum_{m=1}^{M}\sum_{n=1}^{N} T(m, n) S^{i,j}(m, n)}{\sqrt{\sum_{m=1}^{M}\sum_{n=1}^{N} T^2(m, n) \sum_{m=1}^{M}\sum_{n=1}^{N} [S^{i,j}(m, n)]^2}}$$

$$N(i, j) = \frac{\sum_{m=1}^{M}\sum_{n=1}^{N} (T(m, n) - \overline{T(m, n)})(S^{i,j}(m, n) - \overline{S^{i,j}(m, n)})}{\sqrt{\sum_{m=1}^{M}\sum_{n=1}^{N} [T(m, n) - \overline{T(m, n)}]^2 \sum_{m=1}^{M}\sum_{n=1}^{N} [S^{i,j}(m, n) - \overline{S^{i,j}(m, n)}]^2}}$$

$$\overline{T(m, n)} = \frac{1}{M \times N} \sum_{m=1}^{M}\sum_{n=1}^{N} T(m, n)$$

$$\overline{S^{i,j}(m, n)} = \frac{1}{M \times N} \sum_{m=1}^{M}\sum_{n=1}^{N} S^{i,j}(m, n)$$

In the above formula, the template image is T(m,n), its size is M×N, $\overline{T(m,n)}$ is the average pixel grayscale of T(m,n). The searched image area with the upper-left pixel point is (i,j) in the reference image is $S^{i,j}(m,n)$, and $\overline{S^{i,j}(m,n)}$ is the average grayscale value of all pixels in the searched image. Image matching is the matching of the upper-left pixel of the target image area, i.e. the template. The value range of the cross-correlation function N(i,j) is 0≤N(i,j)≤1, and the value depends on the degree of matching between the searched image area with the upper-left pixel point being (i,j) in the reference image and the template image. The larger the value of the cross-correlation function of a pixel, the higher the matching degree of the pixel should be. The pixel with the largest cross-correlation function value is the most matching pixel and should be selected.

After matching of the pixel points of the left and right images, as shown in the figure, according to the imaging principle of the binocular ranging system, two CCD cameras with the same model are placed in parallel on the same plane, and the distance between the projection centers of the left and right cameras is the base line distance B.

The target point A is imaged on the A1 point on the left CCD image plane and the A2 point on the right CCD image plane when passing through the binocular ranging system consisting of left and right cameras with parallel axes, with the positions of $x_{left}$ and $x_{right}$ on the left and right image planes respectively. Knowing that both of the camera focal lengths are f, the measured distance l can be derived according to the similar principle of the triangle:

$$l = \frac{Bf}{x}$$

$$x = x_{left} - x_{right}$$

x is the difference in the position of the imaging points of point A on the left and right CCD image planes respectively captured by the binocular camera, which is also called binocular disparity. Under the ideal condition that the optical axes of the binocular camera are strictly parallel and the images of target object are captured simultaneously, the image matching algorithm is used to determine the corresponding position of the same target in the left and right CCD images. The binocular disparity x can be calculated. Knowing the focal length and the baseline distance, the target distance can be obtained by the above formula. At this point, the initial positioning of the target area to be assembled is completed.

S4 the bio-contact device of the mechanical arm fingertip is used to make contact with the target area after the preliminary positioning in S3. The deformation electrical signal generated by the chip is output to the computer through the signal measuring circuit, and the computer slightly adjusts the position to realize accurate positioning and complete the assembly.

When the mechanical arm is assembling, it will make contact with the PCB board, and pressure will be applied to the fingertips of the mechanical arm. The pressures that the irregular components contact with the area to be assembled and that the irregular components contact with other areas of the PCB board are different. Therefore, a mathematical model of pressure and position can be established, and the assembly target area can be accurately located by adjusting the position of the mechanical arm according to the pressure from the fingertip.

The invention adopts a sensitive material to design a biological contact device. The sensitive material has pressure-electricity output characteristics and can convert the pressure into electrical signal. A bio-contact device made of this sensitive material is generally mounted on the fingertip of the mechanical arm like a finger sleeve. When the fingertip touches the PCB board, the pressure on the conductive material on the bio-contact device will change due to deformation, thereby causing the changes of the output electrical signal. There is a signal measurement circuit between the sensitive material and the mechanical arm fingertip, which can measure the output electrical signal of the bio-contact device that has changed due to deformation and then transmits this signal to the computer. The computer can acquire the current position of the mechanical arm based on the mathematical model obtained in advance, and output the corresponding control signal to adjust the position of the mechanical arm.

In the step 3, the mechanical arm completes the initial positioning of the area to be assembled. Then move the mechanical arm to this area, and after the mechanical arm touches the PCB board, slightly adjust the position of the mechanical arm according to the output signal of the bio-contact device on the fingertip so as to achieve accurate positioning and complete the assembly of the irregular parts.

What claimed is:

1. A multiple lens-based smart mechanical arm, comprising a multi-joint multi-functional mechanical arm, CCD cameras for collecting PCB board images to be assembled, a bio-contact device, and a computer; the CCD cameras are mounted on the multi-joint multi-functional mechanical arm, the bio-contact device is mounted on a fingertip of the multi-joint multi-functional mechanical arm, and the CCD cameras, and the bio-contact device and the multi-joint multi-functional mechanical arm are connected to the computer.

2. The multiple lens-based smart mechanical arm according to claim 1 wherein two CCD cameras are provided and are are installed on a left side and a right side of a forearm of the multi-joint multi-functional mechanical arm respectively.

3. The multiple lens-based smart mechanical arm according to claim 1 wherein the bio-contact device comprises a chip made of a sensitive material and a signal measurement circuit for measuring deformation of the chip and outputting an electrical signal; the chip is covered on the fingertip of the mechanical arm and connected with the signal measurement circuit; the signal measurement circuit is connected with the computer and provided inside the multi-joint multi-function mechanical arm.

4. The multiple lens-based smart mechanical arm according to claim 3 wherein shape of the chip is finger-sleeve type.

5. The multiple lens-based smart mechanical arm according to claim 3 wherein the sensitive material is made of conductive rubber.

6. The multiple lens-based smart mechanical arm according to claim 2 wherein the two CCD cameras have the same model and parameters; coordinate systems of the two camera coplanar and the coordinate axes are in parallel.

7. A positioning and assembly method of a smart mechanical arm comprising,
   (1) transporting PCB to assemble on to the front of a mechanical arm, capturing two images of the PCB to assemble by two CCD cameras comprising a left camera and a right camera, the image being a left and a right image respectively;
   (2) matching the two image with a PCB template pre-inputted in a computer by the computer, and determining a target area for assembling irregular parts in the two images;
   (3) using a binocular positioning algorithm to measure the distance between the target area and a fingertip of the mechanical arm, and controlling the mechanical arm to move to the target area for preliminary positioning by the computer;
   (4) contacting a bio-contact device of the fingertip of the mechanical arm with the target area, wherein a deformation electrical signal generated by a chip on the bio-contact device is output to the computer through a signal measuring circuit, and the computer adjusts a position of the mechanical arm to realize accurate positioning.

8. The positioning and assembly method according to claim 7 wherein, step (2) specifically comprises: filtering and denoising the two images captured by the two CCD cameras of the PCB to assemble on, extracting an edge portion of the PCB by an edge detection operator removing a background portion, enhancing the two images and improving a contrast of same by a piecewise linear transform enhancement method, and determining the target area for assembly by a grayscale-based template matching method.

9. The positioning and assembly method according to claim 7 wherein step (3) specifically comprises:
   (3.1) solving the cameras' internal parameter matrix and external parameter matrix by the Zhang Zhengyou calibration algorithm; performing a binocular stereoscopic calibration to determine a relative position relationship of the left and right cameras, the relative position relationship of the left and right cameras including a rotation matrix R and a translation vector T;
   (3.2) matching the two images pixel by pixel by using gray-scale cross-correlation matching method based on template matching;
   (3.3) determining the distance between the target area and the fingertip of the mechanical arm by the binocular positioning algorithm:

$$l = \frac{Bf}{x}$$

$$x = x_{left} - x_{right}$$

wherein B is the distance between the projection centers of the two camera: when a target point A is imaged on an A1 point on a left CCD image plane and an A2 point on a right CCD image plane when passing through a binocular ranging system consisting of the left and right cameras with parallel axes, $x_{left}$ and $x_{right}$ are the positions of A1 and A2 on the left and right image planes respectively; f is a camera focal length, and x is the difference in the positions of A1 and A2 and is non-zero.

10. The positioning and assembly method according to claim 7, wherein step (4) specifically comprises: after preliminary the positioning, contacting the bio-contact device on the fingertip of the mechanical arm with the PCB to assemble on, wherein a pressure on a sensitive material of the bio-contact device changes due to deformation, thereby changing the output electrical signals; and adjusting the position of the mechanical arm according to the output electrical signals and a mathematical relationship between pressure and position so as to irregular parts in an accurate position.

* * * * *

UNITED STATES PATENT AND TRADEMARK OFFICE
CERTIFICATE OF CORRECTION

PATENT NO. : 10,899,014 B2  
APPLICATION NO. : 15/781856  
DATED : January 26, 2021  
INVENTOR(S) : Juan Du et al.

It is certified that error appears in the above-identified patent and that said Letters Patent is hereby corrected as shown below:

In the Claims

Column 9, Lines 20-21, in Claim 2, delete "provided and are are" and insert --provided and are--

Column 9, Line 34, in Claim 4, delete "wherein shape" and insert --wherein a shape--

Column 9, Line 45, in Claim 7, delete "transporting PCB to" and insert --transporting a PCB to--

Column 9, Lines 46-47, in Claim 7, delete "to assemble by two" and insert --to assemble on by two--

Column 9, Line 50, in Claim 7, delete "the two image" and insert --the two images--

Column 10, Line 40, in Claim 9, delete "two camera: when" and insert --two cameras: when--

Signed and Sealed this  
Twentieth Day of April, 2021

Drew Hirshfeld  
*Performing the Functions and Duties of the*  
*Under Secretary of Commerce for Intellectual Property and*  
*Director of the United States Patent and Trademark Office*